United States Patent [19]

Sibata et al.

[11] Patent Number: 5,089,465
[45] Date of Patent: Feb. 18, 1992

[54] PROCESS FOR PRODUCING OXIDE SUPERCONDUCTING THICK FILMS BY SCREEN PRINTING

[75] Inventors: Kenichiro Sibata; Nobuyuki Sasaki; Shuji Yazu; Tetsuji Jodai, all of Hyogo, Japan

[73] Assignee: Sumitomo Electric Industries, Ltd., Osaka, Japan

[21] Appl. No.: 537,866

[22] Filed: Jun. 14, 1990

Related U.S. Application Data

[63] Continuation of Ser. No. 173,474, Mar. 25, 1988, abandoned.

[30] Foreign Application Priority Data

Mar. 25, 1987 [JP] Japan .................. 62-70970

[51] Int. Cl.$^5$ .......................... B05D 5/12; B05D 3/02
[52] U.S. Cl. ........................... 505/1; 505/741; 427/62; 427/63; 427/282
[58] Field of Search ............... 505/1, 741; 427/62, 427/63, 96, 282

[56] References Cited

U.S. PATENT DOCUMENTS

| | | | |
|---|---|---|---|
| 4,316,785 | 2/1982 | Suzuki et al. | 427/63 |
| 4,392,180 | 7/1983 | Nair | 361/321 |
| 4,632,846 | 12/1986 | Fujinaka et al. | 427/96 |
| 4,695,504 | 9/1987 | Watanabe et al. | 427/101 |
| 4,766,010 | 8/1988 | Takeuchi et al. | 427/96 |

FOREIGN PATENT DOCUMENTS

56-85814  7/1981  Japan .

OTHER PUBLICATIONS

Koinuma et al. "Preparation of $(La_{1-x}Sr_x)Cu\,O_{4-\delta}$ Superconducting Films by Screen Printing Method" Jpn. J. Appl. Phys. vol. 26, No. 4 (1987) L399–L401.

Cava et al. "Bulk Superconductivity at 36k in $La_{1.8}Sr_{0.2}CuO_4$" Phys. Rev. Lett. vol. 58(4) Jan. 1987, pp. 408–410.

Koinuma "High Tc Superconductivity in Screen Printed Yb-Ba-Cu-O Films" Jpn. J. Appl. Phys. 26(5) May 1987 L761–762 (II).

Wu et al., "Superconductivity at 93k in New Mixed-phase Y-Ba-Cu-O Compound System at Ambient Pressure", Physical Review letters B vol. 58 No. 9(1987) pp. 908–910.

Matsumoto et al., "Preparation and Photovoltaic Properties of Screen Printed $CaSlCu_xS$ Solar Cells" Jpn. J. Appl. Phys. vol. 19, No. 1 (1980) L129–134.

Bednorz et al., "Possible High $T_c$ Superconductivity in the Ba-La-Cu-O System", Z. Phys. B—Condensed Matter 64 (1986) pp. 189–193.

*Primary Examiner*—Shrive Beck
*Assistant Examiner*—Roy V. King
*Attorney, Agent, or Firm*—Foley & Lardner

[57] ABSTRACT

A process for producing a superconducting thick film including steps comprising subjecting a powder mixture of oxides or carbonates of Ba, Y and Cu each having an average particle size of less than 5 μm to preliminary sintering, pulverizing the preliminary sintered mass into a powder having an average particle size of less than 10 μm, and then admixing the pulverized powder with an organic vehicle to prepare a paste which is applied on a substrate and is sintered finally. The preliminary sintering is carried out at a temperature ranging from 700° to 950° C., while the final sintering is carried out at a temperature ranging from 800° C. to 1,000° C.

13 Claims, No Drawings

PROCESS FOR PRODUCING OXIDE SUPERCONDUCTING THICK FILMS BY SCREEN PRINTING

This application is a continuation of application Ser. No. 07/173,474, filed Mar. 25, 1988, now abandoned.

BACKGROUND OF THE INVENTION

1. Field of the Invention

The present invention relates to a process for producing a superconducting thick film, more particularly, it relates to a process for producing a superconducting thick film which exhibits a higher critical temperature of superconductivity and a reduced smaller discrepancy between the critical temperature and the onset temperature where phenomenon of superconductivity is started to be observed.

In this specification, "Tc" stands for the critical temperature of superconductivity and "Tcf" stands for the onset temperature where phenomenon of superconductivity is started to be observed.

2. Description of the Related Art

Under the superconducting condition, the perfect diamagnetism is observed and no difference in potential is observed for all that an electric current of a constant finite value is observed, and hence, a variety of applications of superconductivity have been proposed in a field of electric power transmission as a mean for delivering electric power without loss.

The superconductivity can be utilized in the field of power electric applications such as MHD power generation, power transmission, electric power reservation or the like; in the field of transportation for example magnetic levitation trains, or magnetically propelling ships; in the medical field such as high-energy beam radiation unit; in the field of science such as NMR or high-energy physics; a high sensitive sensors or detectors for sensing very weak magnetic field, microwave, radiant ray or the like, or in the field of fusion power generation.

In addition to the abovementioned power electric applications, the superconducting materials can be used in the field of electronics, for example, as a Josephson device which is an indispensable switching device for realizing a high-speed computer which consumes very reduced power.

However, their actual usage have been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2 K. at most. This means that liquidized helium (boiling point of 4.2 K.) is only one cryogen which can realize such very low temperature of Tc. However, helium is not only a limited costly resource but also require a large-scaled system for liquefaction. Therefore, there had been a strong demand for other superconducting materials having higher Tc. But no material which exceeded the abovementioned Tc had been found for all studies for the past ten years.

Possibility of existence of a new type of superconducting materials having much higher Tc was revealed by Bednorz and Müller who discovered a new oxide type superconductor in 1986 [Z. Phys. B64 (1986) 189] This new oxide type superconducting material is $[La, Ba]_2CuO_4$ or $[La, Sr]_2CuO_4$ which are called as the $K_2NiF_4$-type oxide having a crystal structure which is similar to known perovskite type oxide. The $K_2NiF_4$-type oxides show such higher Tc as 30 to 50 K. which are extremely higher than the known superconducting materials and hence it becomes possible to use liquidized hydrogen (b.p.=20.4 K.) or liquidized neon (b.p.=27.3 K.) as a cryogen which bring them to exhibit the superconductivity.

It was also reported in the paper that C. W. Chu et al discovered in the United States of America another type of superconducting material having the critical temperature of in the order of 90 K. in February 1987, and hence possibility of existence of high-temperature superconductors have burst on the scene.

However, the abovementioned superconducting materials of perovskite type oxides or quasi-perovskite type oxides which was just born have been studied and developed only in a form of sintered bodies or as in a form of bulk produced from powders. Therefore, they are inconvenient for handling, because the sintered bodies are fragile and hence are apt to be broken by even very weak mechanical load. In other words, they can not be utilized in practice in the form of a fine wire which is required in the field of power transmission.

Therefore, an object of the present invention is to solve the abovementioned problems and to provide a new superconducting material which exhibit higher "Tc" and "Tcf" and possessing improved mechanical strength.

SUMMARY OF THE INVENTION

The present invention provide a process for producing a superconducting thick film, characterized by the steps comprising mixing powders of oxide or carbonate of an element "α" which is selected from a group of elements of IIa and IIIa groups in the Periodic Table, oxide or carbonate of an element "β" which is selected from a group of elements of IIa and IIIa groups in the Periodic Table and which may be the same element as said element "α", oxide or carbonate of an element "γ" selected from a group of elements of Ib, IIb, IIIb and VIII groups in the Periodic Table in such proportions that the atom ratio of said elements "α", "β" and "γ" satisfy the following range:

$$\alpha:\beta:\gamma = (0 \text{ to } 1):(0 \text{ to } 1):(0 \text{ to } 1)$$

each of said powders having an average particle size of less than 5 μm;

subjecting the powder mixture to preliminary sintering;

pulverizing the preliminary sintered mass obtained into a powder having an average particle size of less than 10 μm;

admixing the pulverized powder obtained with organic vehicle to prepare a paste;

applying said paste onto a substrate by means of a screen printing technique;

drying the coated paste; and then subjecting the coated paste to the final sintering, whereby, a superconducting thick film of perovskite type oxide or quasi-perovskite type oxide is formed on the substrate.

The perovskite type oxide or quasi-perovskite type oxide which constitute the abovementioned superconducting thick film contain an oxide or oxides which have an average crystal grain size of less than 15 μm and which have the general formula:

$$\alpha_w \beta_x \gamma_y \delta_z$$

wherein,

"α" stands for an element which is selected from a group of elements of IIa and IIIa groups in the Periodic Table, "β" stands for an element which is selected from a group of elements of IIa and IIIa groups in the Periodic Table and which may be the same element as said element "α", "γ" stands for an element selected from a group of elements of Ib, IIb IIIb and VIII groups in the Periodic Table, and "δ" stands for oxygen (O), each of "w", "x" and "y" represents a number selected in a range of from 0 to 1, and "z" represents a number which is selected from a range of from 1 to 5.

The term of "quasi-perovskite type oxide" means any oxide which can be considered to possess such a crystal structure that is similar to perovskite-type oxides and includes an orthorhombically distorted perovskite or a distorted oxygen-deficient perovskite or the like.

The oxides or carbonates of the elements of "α", "β" and "γ" are mixed in proportions that the elements of "α", "β" and "γ" in the final product obtained by the final sintering step have an atom ratio which satisfies the abovementioned range.

The organic vehicle can be selected from a variety of pastes which have been used for producing thick films, such as a solution of ethyl cellulose dissolved in telpionel, a solution of acryl resin dissolved in butylacetate carbitol or the like.

The essence of the process for producing the thick film according to the present invention reside in the steps comprising sintering preliminarily a powder mixture of the abovementioned oxides or carbonates having an average particle size of less than 5 μm, pulverizing the preliminary sintered mass into a powder having an average particle size of less than 10 μm, and then admixing the pulverized powder into an organic vehicle to prepare a paste which is applied on a substrate and is sintered finally.

It is supposed that substance which exhibit higher critical temperature is produced or concentrated at grain boundaries or interfaces among crystal grains in case of the abovementioned perovskite type oxide or quasi-perovskite type oxide. The thick film obtained according to the present invention possesses very fine crystal structure which may be attributed to its characteristic process and which may be a reason of such higher critical temperature.

In fact, according to the present invention, the starting material powder must have an average particle size of less than 5 μm, because of a reason that, if the average particle size exceeds 5 μm, it is difficult to realize satisfactory dimensional reduction of crystal grains by the pulverization of the sintered mass. An average particle size of conventional pulverized particles exceed more than 6 μm.

The pulverization which is carried out after the preliminary sintering step exert a direct influence upon crystal grains which are obtained after the final sintering. Namely, if the average particle size of powder obtained by the preliminary sintering step exceed 10 μm, a sintered body which is obtained by the final sintering step contain larger crystal grains which result in decrease of an area of grain boundaries. This decrease of the area of grain boundaries is unfavorable for realizing higher critical temperature.

The sequence of preliminary sintering, pulverization and compacting or press-molding is preferably repeated for several times in order to promote solid solution reaction of the material powders and/or the preliminary sintered powder as well as to obtain the abovementioned finer crystal grains which will be subjected to the final sintering.

The temperature in the final sintering step is a very critical factor and must be controlled in such manner that the sintering of solid phase reaction proceed satisfactorily and that excessive crystal growth do not occur in the perovskite type oxide or quasi-perovskite type oxide obtained.

Taking this control condition into consideration, we found, after experiments, such a fact that, if the final sintering is carried out at a temperature of not higher than 800° C., the final product of sintered body does not show satisfactory mechanical strength and that, to the contrary, if the final sintering is carried out at a temperature which exceed 1,000° C., the resulting sintered body contain solid solution phase or larger crystal grains. Therefore, the temperature must be within a range from 800° C. to 1,000° C.

The preliminary sintering also must be carried out at a temperature which is higher than 700° C. but below 950° C. because of the same reason as above. Namely, if the temperature is not higher than 700° C., satisfactory solid reaction do not proceed so that the objective perovskite type oxide or quasi-perovskite type oxide can not be obtained, while, if the preliminary sintering is carried out at a temperature which exceed 950° C., the resulting preliminary sintered mass contain solid solution phase or larger crystal grains which make it difficult to obtain finer particles in following pulverization step.

It is also supposed that the superconductors of the perovskite type oxide or quasi-perovskite type oxide exhibit its improved property particularly in the neighborhood of its surface portion, since a reaction between the superconductor and the surrounding atmosphere during the sintering step or the heat-treatment step may proceed favorably in the neighborhood of the surface portion.

Accordingly, it is preferable to adjust viscosity of the paste for forming the thick film as well as thickness of a film coated on a substrate. In fact, if the thickness of the paste coated on the substrate is not thicker than 10 μm, the paste can not be coated uniformly so that a continuous film or layer can not be produced. To the contrary, when the thickness of the paste coated exceed 50 μm, the coated film can not only have a sharp pattern or shape but also possess different properties between its facial portion and a portion which is adjacent to the substrate.

According to another preferred embodiment, the thick film obtained is further heat-treated in order to produce substantially uniform perovskite type oxide or quasi-perovskite type oxide. This heat-treatment is very effective to improve the critical temperature from which electrical resistance become zero. The temperature of this heat-treatment is preferably carried out at a temperature ranging from 500° C. to 800° C.

In fact, if the temperature of the heat-treatment is not higher than 500° C., the improvement can not be expected or very longer time is necessary before the desired perovskite type oxide or quasi-perovskite type oxide is obtained. To the contrary, when the heat-treatment is carried out at a temperature which exceeds 800° C., the crystal structure of perovskite disappears to lower the critical temperature. Generally, the Tc will be improved by 3° to 5° C. by this heat-treatment.

According to another aspect of the present invention, the sintered mass obtained after the final sintering may be quenched rapidly, directly after the final sintering or after the sintered mass is re-heated at a temperature ranging from 500° to 800° C. in order to improve the critical temperature.

The thick film produced by the present invention exhibits an improved superconductivity which last long and is stable. This effect might be obtained by increased area of crystal grains caused by the pulverization into finer crystal grains as well by uniform distribution of deficiency density of oxygen.

The superconductor supported on a substrate in a form of a thick film according to the present invention can be handled easily owing to its mechanical stability and is economical because it can eliminate or save excess material which is necessary to give the self-supporting property or mechanical strength to the superconductor itself.

Now, embodiments of the process according to the present invention will be described with reference to illustrative Examples, but the scope of the present invention should not be limited thereto.

EXAMPLES

At first, powders of $BaCO_3$, $Y_2O_3$, and $CuO$ are mixed uniformly in such proportions that the value of "x" in the formula:

$$Ba_{1-x}Y_xCu_1O_3$$

becomes equal to 0.2, 0.4 and 0.8 respectively to prepare three powder mixtures.

All of the powder mixture are sintered preliminarily at 900° C. for 12 hours in air to obtain a cake-like solid mass of preliminary sintered body. Then, the solid mass is pulverized by means of alumina balls in a ball mill for 8 hours to prepare a powder having an average particle size of 4 μm. The same procedure as the abovementioned combination of preliminary sintering and pulverization is repeated for three times so that the final pulverization produce a finer preliminary sintered powder having an average particle size ranging from 2 to 3 μm.

The preliminary sintered powder thus obtained is admixed with an organic vehicle comprising ethyl cellulose dissolved in telpionel is kneaded in a molter. Then, the resulting paste is further treated in a multi-axis vertical mixer and then by means of three rolls made of high purity alumina. The viscosity of the paste is determined by a viscosimeter and is adjusted to a value of 500 poise.

The resulting paste is applied on a substrate made of alumina through a stainless steel screen having 200 mesh to produce a thick film having a thickness of about 30 μm. The thickness of the film reduces to 25 μm after the film is dried at 150° C. for 15 minutes.

The dried film supported on the substrate is then sintered finally at 930° C. for 24 hours in $O_2$.

Electrodes are connected to the opposite ends of the resulting thick film with conductive silver paste by an ordinary method to determine the critical temperature (Tc) and the onset temperature (Tcf) of the thick film by the common four probe method in a cryostat. Temperature is measured by a calibrated Au(Fe)-Ag thermocouple. Then, the temperature dependence of resistance of the test samples are determined with rising the temperature gradually. Table 1 shows the results of Tc and Tcf.

The same procedure as above is repeated for the other combinations of elements selected from IIa group and IIIa group of the Periodic Table and the results are also summarized in the Table 1.

The critical temperature is measured again after three weeks under the same conditions as above but no substantial change of the Tc is observed in the case of the abovementioned thick films. The changes of Tc of the superconducting thick films are only ±1 K. The same result is observed by the measurement of AC susceptibility by L meter.

TABLE 1

| Sample No. | Composition Combinasion | Atom ratio | Substrate | Tc | Tcf | DT |
|---|---|---|---|---|---|---|
| 1 | Ba—Y | 0.2 | alumina | 95 | 80 | 15 |
| 2 | Ba—Y | 0.4 | alumina | 97 | 78 | 19 |
| 3 | Ba—Y | 0.8 | alumina | 85 | 67 | 18 |
| 4 | Ba—Y | 0.2 | AlN | 94 | 81 | 13 |
| 5 | Ba—Y | 0.4 | AlN | 95 | 82 | 13 |
| 6 | Ba—Y | 0.8 | AlN | 86 | 69 | 17 |
| 7 | Ba—Yb | 0.4 | alumina | 92 | 76 | 16 |
| 8 | Ba—Eu | 0.4 | alumina | 91 | 74 | 17 |
| 9 | Ba—La | 0.2 | alumina | 75 | 62 | 13 |
| 10 | Ba—Nd | 0.4 | alumina | 89 | 76 | 13 |
| 11 | Ba—Gd | 0.4 | alumina | 86 | 78 | 8 |
| 12 | Ba—Dy | 0.4 | alumina | 87 | 77 | 10 |
| 13 | Ba—Ho | 0.4 | alumina | 91 | 74 | 17 |
| 14 | Ba—Er | 0.4 | alumina | 92 | 70 | 22 |
| 15 | Ba—Tm | 0.4 | alumina | 80 | 68 | 12 |
| 16 | Ba—Lu | 0.4 | alumina | 93 | 75 | 18 |

What we claimed are:

1. A process for producing a superconducting thick film, comprising the steps of:

mixing powders of oxide or carbonate of Ba, oxide or carbonate of an element "β" which is selected from a group consisting of Y, Yb, Eb, La, Nd, Gd, Dy, Ho, Er, Tm and Lu, and oxide or carbonate of Cu in such proportions that the atom ratio of said elements Ba, "β" and Cu satisfy $$Ba_{1-x}\beta_xCu_1$$

where x is between 0.2 and 0.8, each of said powders having an average particle size of less than 5 μm;

subjecting the powder mixture to preliminary sintering at a temperature between 700° and 950° C.;

pulverizing the preliminary sintered mass obtained into a powder having an average particle size of less than 10 μm;

admixing the pulverized powder obtained with an organic vehicle to prepare a paste;

applying said paste in a thickness between 10 and 50 μm onto a substrate by means of a screen printing technique;

drying the coated paste; and then subjecting the coated paste to final sintering under an oxidative condition selected from the group consisting of air and an oxygen atmosphere having a pressure of 5 to 10 atm, at a temperature between 800° and 1,000° C.,
whereby a superconducting thick film of perovskite type oxide or quasi-perovskite type oxide which is represented by the formula:

$$Ba_{1-x}\beta_x Cu_1 O_3$$

wherein "$\beta$" has the same definition as above, the value of x being in the range between 0.2 and 0.8 and which has an average crystal grain size of less than 15 μm, is formed on the substrate.

2. A process claimed in claim 1, characterized in that a sequence including preliminary sintering, pulverization and compacting of the pulverized powder is repeated for at least three times.

3. A process claimed in claim 1, characterized in that sintered mass obtained by the last preliminary sintering operation is pulverized into a powder having an average particle size of less than 8 μm.

4. A process claimed in claim 1, characterized in that said pulverization is carried out by a ball mill.

5. A process claimed in claim 1, characterized in that said pulverization is carried out by a jet mill.

6. A process claimed in claim 1, characterized in that said organic vehicle is composed of resin and solvent.

7. A process claimed in claim 6, characterized in that said resin is ethylcellulose resin or acryl resin.

8. A process claimed in claim 6, characterized in that said solvent is telpionel or butylacetate carbitol.

9. A process claimed in claim 1, characterized in that said paste have a viscosity ranging from 100 to 1,000 poise.

10. A process claimed in claim 1, characterized in that said screen printing is performed by means of a stainless mesh screen having openings of from 100 to 325 mesh.

11. A process claimed in claim 1, characterized in that said paste is dried at a temperature ranging from 100° to 200° C.

12. A process claimed in claim 1, characterized in that the sintered mass obtained after the final sintering is further annealed at a temperature ranging from 400° to 700° C.

13. A process claimed in claim 1, characterized in that the sintered mass obtained after the final sintering is quenched rapidly, directly after the final sintering or after the sintered mass is re-heated at a temperature ranging from 500° to 800° C.

* * * * *